(12) United States Patent
Held

(10) Patent No.: US 7,919,969 B2
(45) Date of Patent: Apr. 5, 2011

(54) NETWORK ANALYZER COMPRISING A SWITCHABLE MEASURING BRIDGE

(75) Inventor: Werner Held, Pocking (DE)

(73) Assignee: Rohde & Schwarz GmbH & Co. KG, München (DE)

( * ) Notice: Subject to any disclaimer, the term of this patent is extended or adjusted under 35 U.S.C. 154(b) by 336 days.

(21) Appl. No.: 12/096,490

(22) PCT Filed: Feb. 1, 2007

(86) PCT No.: PCT/EP2007/000879
§ 371 (c)(1),
(2), (4) Date: Jun. 6, 2008

(87) PCT Pub. No.: WO2007/090564
PCT Pub. Date: Aug. 16, 2007

(65) Prior Publication Data
US 2008/0290880 A1 Nov. 27, 2008

(30) Foreign Application Priority Data

Feb. 3, 2006 (DE) .................... 10 2006 005 040

(51) Int. Cl.
*G01R 27/04* (2006.01)
(52) U.S. Cl. .................. 324/638; 324/76.77; 324/76.23; 702/106; 702/117; 702/120
(58) Field of Classification Search .................... 324/638
See application file for complete search history.

(56) References Cited

U.S. PATENT DOCUMENTS

| 3,983,323 A | 9/1976 | Griffith et al. |
| 4,808,913 A * | 2/1989 | Grace ........................ 324/638 |
| 6,348,804 B1 | 2/2002 | Evers |
| 7,019,510 B1 * | 3/2006 | Bradley .................. 324/76.23 |
| 2004/0066182 A1 | 4/2004 | Evers et al. |
| 2006/0001505 A1 | 1/2006 | Fojas |
| 2006/0197626 A1 | 9/2006 | Ehlers et al. |

FOREIGN PATENT DOCUMENTS

| DE | 35 40 479 | 6/1986 |
| DE | 39 16 855 C1 | 5/1990 |
| DE | 199 26 454 | 12/2000 |
| DE | 102 46 640 | 4/2004 |
| DE | 102 46 700 | 4/2004 |

* cited by examiner

*Primary Examiner* — Timothy J Dole
*Assistant Examiner* — Benjamin M Baldridge
(74) *Attorney, Agent, or Firm* — Marshall, Gerstein & Borun LLP

(57) ABSTRACT

The invention relates to a network analyzer comprising a signal generator for generating an excitation signal which can be supplied to a measuring object connectable to a network analyzer by means of a measuring line, and a measuring bridge which is connected to the measuring line by means of signal transmission. A reference signal corresponding to the excitation signal can be extracted from a reference channel, and a measuring signal corresponding to a signal corresponding to a signal reflected from the measuring object can be extracted from a measuring channel. the measuring bridge comprises a resistive bridge and at least one hybrid coupler which is connected to the resistive bridge in series. the measuring bridge is operated as a resistive bridge in a low frequency range and as a hybrid coupler in a upper frequency range.

13 Claims, 4 Drawing Sheets

NETWORK ANALYZER COMPRISING A SWITCHABLE MEASURING BRIDGE

BACKGROUND OF THE INVENTION

1. Field of the Invention

The invention relates to a network analyzer for analyzing a test object which can be connected thereto.

2. Related Technology

An excitation signal is made available by a network analyzer for analyzing a test object. The excitation signal is fed to said test object via gates thereof. For example, in order to determine an input reflection coefficient and a forward transmission coefficient, and an output reflection coefficient and a reverse transmission coefficient, the excitation signal is fed to the test object, which comprises an input gate and an output gate, via said input gate or said output gate. In order to determine the reflection coefficients and the transmission coefficients, the respective incident and the returning waves of the excitation signal at the input gate and/or the output gate of the test object are to be determined. In order to determine the frequency range at which the excitation signal passes through the test object, and the frequency range at which the excitation signal is reflected at the input gate and/or the output gate of the test object, the network analyzer drives the frequency of the excitation signal through a predetermined frequency range in a frequency sweep.

A network analyzer of this type is known, for example, from the publication DE 102 46 640 A1.

In FIG. 4, the gate parameter "forward transmission coefficient $s_{21}$" of a test object, which is formed as a band-pass filter, is shown in relation to frequency. The gate parameter $s_{21}$ describes the relationship between the returning wave $b_2$ at the output gate of the test object, which wave is transmitted through the test object, and the incident wave $a_1$ of the excitation signal at the input gate. The excitation signal is reflected at the input gate of the band-pass filter in both frequency range A and in frequency range C. In frequency range B, the excitation signal is transmitted through the band-pass filter.

In a conventional network analyzer, the transition between the frequency ranges A and C, denoted in the following as the stop band, and the frequency range B, denoted in the following as the pass band, can only be measured comparatively inaccurately. In addition, the frequency range at which the respective transition takes place can only be inaccurately determined. Furthermore, a network analyzer of this type cannot readily analyze the test object over a comparatively large frequency range of from particularly low to particularly high frequencies.

On the one hand, this is due to the fact that the network analyzer sweeps a specific frequency range. However, decoupling a reference signal which corresponds to the excitation signal, and decoupling a measuring signal which corresponds to a signal returning from the test object, on a measuring bridge provided on the network analyzer as a resistive bridge for analyzing the excitation signal which is reflected at the input gate or the output gate of the test object or is transmitted through the test object, is problematic particularly at comparatively high frequencies, due to parasitic elements emerging on the measuring bridge, by means of which disruptive influences on the decoupled signals become noticeable.

On the other hand, this is due to the fact that the coupling paths provided in the measuring bridge formed as a directional coupler are only intended for a specific frequency range. For example, decoupling a reference signal and/or a measuring signal comprising an excitation signal of a comparatively low frequency requires particularly long coupling paths, which can only be achieved with a disproportionately high degree of technical effort.

When analyzing the test object, the conventional network analyzer thus quickly reaches its limits, since, at comparatively low and high frequencies, the reference signal and the measuring signal can only be decoupled with a particularly low level of quality due to a particularly marked attenuation in the excitation signal or the returning signal during decoupling on the measuring bridge. As a result, for example, the percentage of the excitation signal reflected at the test object or the excitation signal transmitted through the test object can be only inaccurately determined at high or low frequencies. The dynamics of a network analyzer of this type, which are to be understood as the ratio of the minimum and maximum measurable transmissions, are therefore comparatively low at high and low frequencies.

GENERAL DESCRIPTION

The invention provides in a particularly cost-effective manner a network analyzer for analyzing a test object with can be connected thereto, in which the frequency range required for a particularly exact analysis of the test object can be evaluated over the entire width of the frequency range made available by the network analyzer, and in which the dynamics of the network analyzer are extended.

Accordingly, the invention provides a network analyzer comprising a signal generator for generating an excitation signal which can be fed via a measuring line to a test object which can be connected to the network analyzer, and comprising a measuring bridge which is connected by means of signals to the measuring line and via which a reference signal, which corresponds to the excitation signal, can be decoupled on a reference channel and a measuring signal, which corresponds to a signal returning from the test object, can be decoupled on a measuring channel, characterised in that the measuring bridge comprises at least one resistive bridge and at least one directional coupler connected in series thereto in such a way that the measuring bridge is operated in a lower frequency range as a resistive bridge and in an upper frequency range as a directional coupler.

The network analyzer according to the invention thus comprises a signal generator, with which an excitation signal can be generated for analyzing a test object which can be attached to the network analyzer, and which signal can be fed to said test object via a measuring line, and also comprising a measuring bridge which is arranged on a measuring line and via which a reference signal, corresponding to an excitation signal, can be decoupled on a reference channel and a measuring signal, corresponding to a signal returning from the test object on the measuring line, can be decoupled on a measuring channel. The measuring bridge of the network analyzer further comprises a resistive bridge and a directional coupler, which is connected in series with the resistive bridge. A plurality of directional couplers can optionally be connected in series with the resistive bridge. In addition, the measuring bridge is formed in such a way that the reference signal and the measuring signal can be decoupled on the reference channel or the measuring channel by the resistive bridge in a lower frequency range and by the directional coupler in an upper frequency range.

The directional coupler and the resistive bridge decouple a portion of the power on the measuring line and thereby separate the decoupled power of the forward wave of the excitation signal from the decoupled power of the returning wave of the returning signal.

The test object can be a multipole comprising one or more input gates and one or more output gates. Said multipole can be connected, by means of signals via both the input gate and the output gate, to the measuring line of the network analyzer for analyzing said multipole. This means that the excitation signal can be fed to the test object both at the input gate and the output gate.

The frequency range swept through by the signal generator of the network analyzer for analyzing the test object can be divided into the upper and lower frequency ranges. The measuring bridge is operated as a resistive bridge in the lower frequency range. Above a specific maximum frequency limit, it becomes noticeable that parasitic elements of the transformer and of the resistors of the resistive bridge have a disruptive effect on the decoupling of the excitation signal and/or the return signal. The measuring bridge is therefore operated above the maximum frequency limit in the upper frequency range as a directional coupler. The directional coupler is thus formed to cover the upper frequency range. Decoupling the excitation signal and/or the returning signal below a minimum frequency limit would involve a high degree of technical effort and cause disproportionately high costs in producing the directional coupler, since, for example, coupling paths of the directional coupler would have to be comparatively long to decouple the excitation signal and/or the returning signal below the minimum frequency limit. In turn this would cause the dimensions of the directional coupler, the measuring bridge and, finally, the network analyzer to increase considerably.

The maximum frequency limit of the resistive bridge generally does not coincide with the minimum frequency limit of the directional coupler. The minimum frequency limit and the maximum frequency limit thus define a frequency limit range between the two limits representing an intersection of the upper and lower frequency ranges. The measuring bridge can be operated both as the resistive bridge and the directional coupler in the frequency limit range.

According to an advantageous development, the measuring bridge comprises change-over switches which are provided to switch between operation of the measuring bridge as a resistive bridge and operation of the resistive bridge as a directional coupler. If the measuring bridge is operated as a resistive bridge or as a directional coupler, the reference signal corresponding to the excitation signal on the reference branch of the resistive bridge or of the directional coupler can be decoupled and can be fed to the reference channel of the measuring bridge. The signal, which returns on the measuring line and corresponds to an excitation signal reflected at the input gate or output gate of the test object or transmitted through the test object, can be decoupled as the measuring signal on the measuring branch of the resistive bridge or the directional coupler. The decoupled measuring signal can be fed via the measuring branch of the resistive bridge or the directional coupler to the measuring channel of the measuring bridge. For this purpose, the reference branches of the resistive bridge and of the directional coupler and the measuring branches of the resistive bridge and of the directional coupler can be connected by means of signals to the reference channel or the measuring channel of the measuring bridge.

Expediently provided on the measuring bridge are a signal-generator-side change-over switch and a first test-object-side change-over switch, between which the resistive bridge and the directional coupler are formed. In operation of the measuring bridge as a directional coupler, the signal-generator-side change-over switch and the first test-object-side change-over switch are switched in such a way that the excitation signal advancing on the measuring line to the test object passes through a through-branch of the directional coupler, which has a comparatively low level of damping, and through the signal-generator-side and first measuring-object-side change-over switches and reaches the test object virtually undamped.

In order to decouple the returning signal as the measuring signal on the measuring line of the network analyzer so as to be virtually undamped, the measuring branch, configured as the coupling path, of the directional coupler is to be suitably positioned with respect to the measuring line of the directional coupler. For this purpose, the measuring branch of the directional coupler precedes the first test-object-side change-over switch in a direction of travel in such a way that the signal returning from the test object on the measuring line initially passes through a path portion of the measuring line, which portion extends in the direct vicinity of the measuring branch of the directional coupler and subsequently reaches the test-object-side change-over switch. The direction of travel of the returning signal is thus defined as a direction with a directional arrow, the start point of which is located at the test object and the arrow tip thereof indicates the direction towards the signal generator.

By contrast, if the measuring bridge is operated as a resistive bridge, the signal returning from the test object passes through the first test-object-side change-over switch and is decoupled by means of a transformer, provided on the resistive bridge, on a measuring branch of the resistive bridge.

According to an advantageous configuration, the directional coupler and the resistive bridge are formed in the measuring bridge in such a way that the reference branch of the directional coupler and the reference branch of the resistive bridge are formed in a common branch.

In order to feed the decoupled measuring signal to the measuring channel of the measuring bridge, both in operation of the measuring bridge as a directional coupler and in operation of the measuring bridge as a resistive bridge, a first measuring-channel-side change-over switch is provided on the measuring channel of the measuring bridge in a expedient development. The first measuring-channel-side change-over switch is switched to either the measuring branch of the directional coupler or the measuring branch of the resistive bridge depending on whether the resistive bridge is operating as the directional coupler or the resistive bridge.

In order to considerably improve decoupling of the measuring signal in terms of damping by components required for decoupling, such as change-over switches, the transformer of the resistive bridge and the coupling path of the directional coupler, it is advantageous to provide a second test-object-side change-over switch on the measuring bridge. The second test-object-side change-over switch can form a through-path, by means of which the measuring line of the network analyzer can be connected by a line connection to the measuring channel of the measuring bridge. In this way, the returning signal can be transmitted in a line-conducted manner from the test object in the measuring channel of the measuring bridge. A through-path of this type has a comparatively low level of damping.

Like the through-path between the signal-generator-side change-over switch and the first test-object-side change-over switch, the returning signal is consequently virtually undamped, since it only passes through the second test-object-side change-over switch and a second measuring-channel-side change-over switch which switches between the measuring branch of the directional coupler or the measuring branch of the resistive bridge and the through-path.

The second measuring-channel-side change-over switch expediently follows the first measuring-channel-side change-over switch in order to avoid a third change-over switch in the through-path. Furthermore, it is expedient for the second test-object-side change-over switch to precede the first test-object-side change-over switch in the direction of travel of the returning signal since the returning signal then does not have to pass through the first test-object-side change-over switch, but can be fed directly to the measuring channel.

In an expedient development, the change-over switches provided on the measuring bridge are formed as electromechanical switches. In this case, the electromechanical switches are formed in such a way that while the signal generator sweeps through the frequency range to analyze the test object, the signal-generator-side change-over switch, the first test-object-side change-over switch and the first measuring-channel-side change-over switch detect when a switching frequency in the aforementioned frequency range is crossed and switching from operation of the measuring bridge as a directional coupler or a resistive bridge to operation of the measuring bridge as a resistive bridge or as a directional coupler is carried out with the same change-over switches.

The advantages achieved by the invention are in particular that the excitation signal, which is to be fed to the test object and which passes through the measuring bridge along a through-path on the way to the test object, only experiences a particularly low level of damping on the measuring bridge of the network analyzer according to the invention. The insertion loss of the measuring bridge is therefore particularly low in this case.

In addition, the network analyzer according to the invention for analyzing the test object can be used over a predetermined frequency range of from particularly low to particularly high frequencies.

Furthermore, the use of the through-path for transmitting the returning signal to the measuring channel of the measuring bridge over the entire frequency range to be swept by the signal generator is particularly advantageous when the measuring bridge receives an excitation signal which is transmitted through the test object as a returning signal. In this case, the measuring bridge acts as what is known as a transmission meter. In contrast thereto, the measuring bridge serves as a reflection meter when the measuring bridge receives an excitation signal which is reflected at the test object as the returning signal.

In addition, the measuring bridge is formed in such a way that further directional couplers can be connected in series with the series connection of the resistive bridge and the directional coupler.

Moreover, the measuring bridge is formed in terms of a circuit in such a way that, when operating the measuring bridge as a transmission meter, a through-path with a particularly low level of damping can be connected between the measuring line of the network analyzer and the measuring channel of the measuring bridge, the through-path being usable instead of a coupling path for transmitting the returning signal on the measuring channel of the measuring bridge.

In addition, the measuring bridge of the network analyzer according to the invention is constructed in a particularly cost-effective manner since the reference branch of the directional coupler and the reference branch of the resistive bridge are combined in terms of the circuit at least in part to form one reference branch.

Furthermore, the change-over switches provided in the measuring bridge as formed as electromechanical switches, which, when the switching frequency is crossed, switch the measuring bridge, which is operating as a directional coupler or as a resistive bridge, to operation as a resistive bridge or as a directional coupler.

BRIEF DESCRIPTION OF THE DRAWINGS

In the following, embodiments of the invention will be described in greater detail with reference to the drawings, in which.

DETAILED DESCRIPTION

Figure 1:
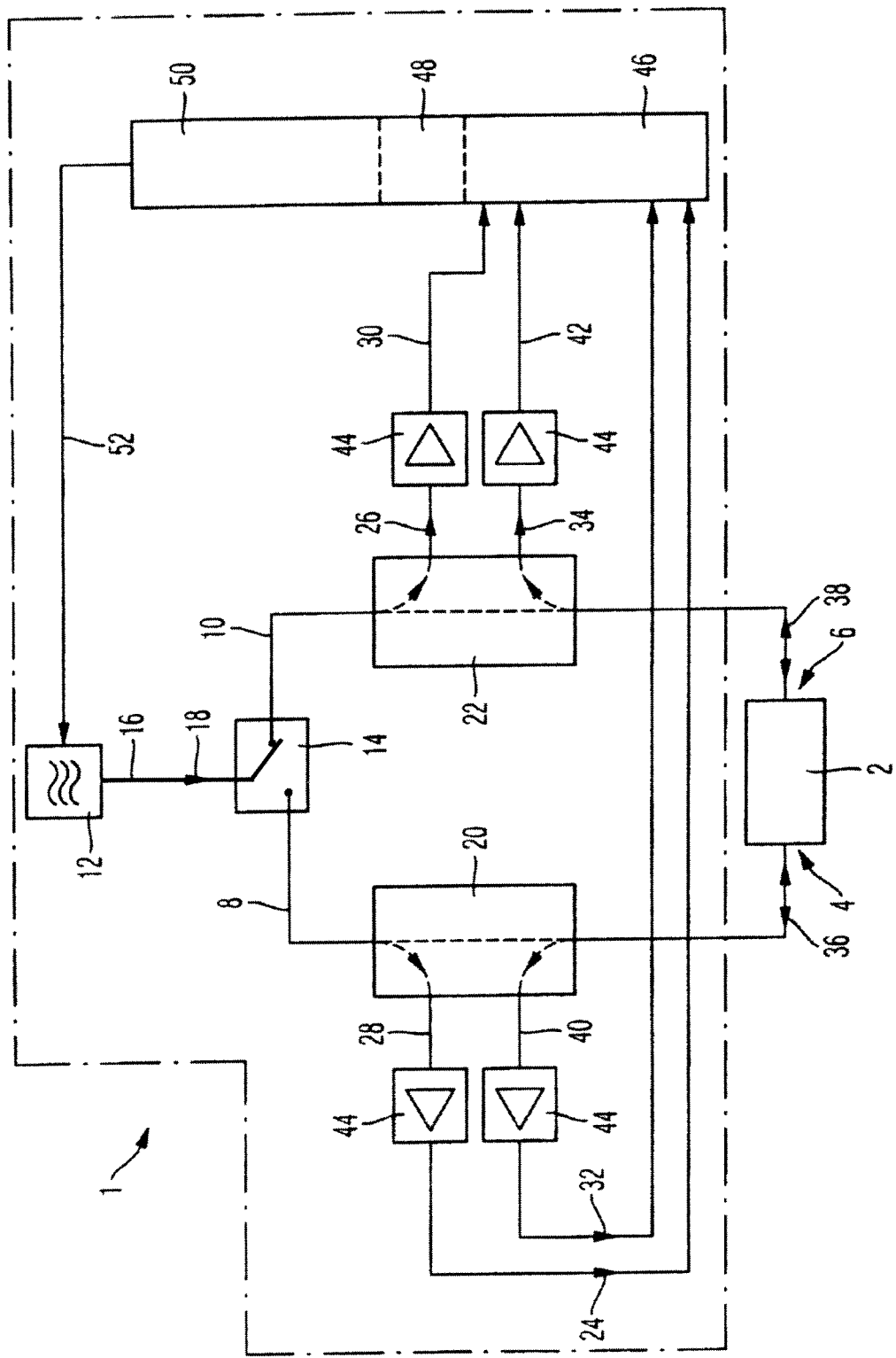
FIG. 1 is a basic circuit diagram of a network analyzer with a test object connected thereto and comprising measuring bridges.

In FIG. 1, a basic circuit diagram of a network analyzer 1 is shown to provide an overview. A test object 2 comprising an input gate 4 and an output gate 6 is connected to the network analyzer 1 via measuring lines 8 and 10. The network analyzer 1 also comprises a signal generator 12 and a switch device 14, which is formed, for example, as an electromechanical switch, via which an advancing excitation signal 18, which is generated by the signal generator 12 and is made available on the signal line 16, is transmitted on the measuring line 8 leading to the input gate 4 or on the measuring line 10 leading to the output gate 6.

The network analyzer 1 further comprises measuring bridges 20 or 22 on the measuring lines 8 and 10. The measuring bridge 20 differs from the measuring bridge 22 only in that the measuring bridge 20 is arranged on the measuring line 8 which is connected to the input gate 4 of the test object 2. In contrast, the measuring bridge 22 is arranged on the measuring line 10 which is connected to the output gate 6 of the test object 2. A reference signal 24, 26, which corresponds to the excitation signal 18, on a respective reference channel 28, 30 and a measuring signal 32, 34, which corresponds to a signal 36, 38 returning from the test object 2, on a measuring channel 40, 42 are decoupled by a respective measuring bridge 20, 22. The reference channel 28, 30 and the measuring channel 40, 42 each comprise an amplifier 44 which amplifies the reference signal 24, 26 and the measuring signal 32, 34. Furthermore, the reference channel 28, 30 and the measuring channel 40, 42 are connected by means of signals to an A/D converter (analogue/digital converter) 46, to which the decoupled reference signal 24, 26 and the decoupled measuring signal 32, 34 are fed.

The A/D converter 46 is also connected by means of signals to an evaluation device 48 which analyzes the reference signal 24, 26 and the measuring signal 32, 34. In addition, the evaluation device 48 is connected by means of signals to a control device 50 which activates the signal generator 12 via a control signal line 52. The signal generator 12 is activated by the control device 50 via the control signal line 52 to generate the excitation signal 18 with a predetermined frequency for analyzing the test object 2. The test object 2 can optionally be analyzed for a plurality of frequencies in a predetermined frequency range. In this case, the control device 50 causes the signal generator 12 to sweep the frequency range.

Figure 2:
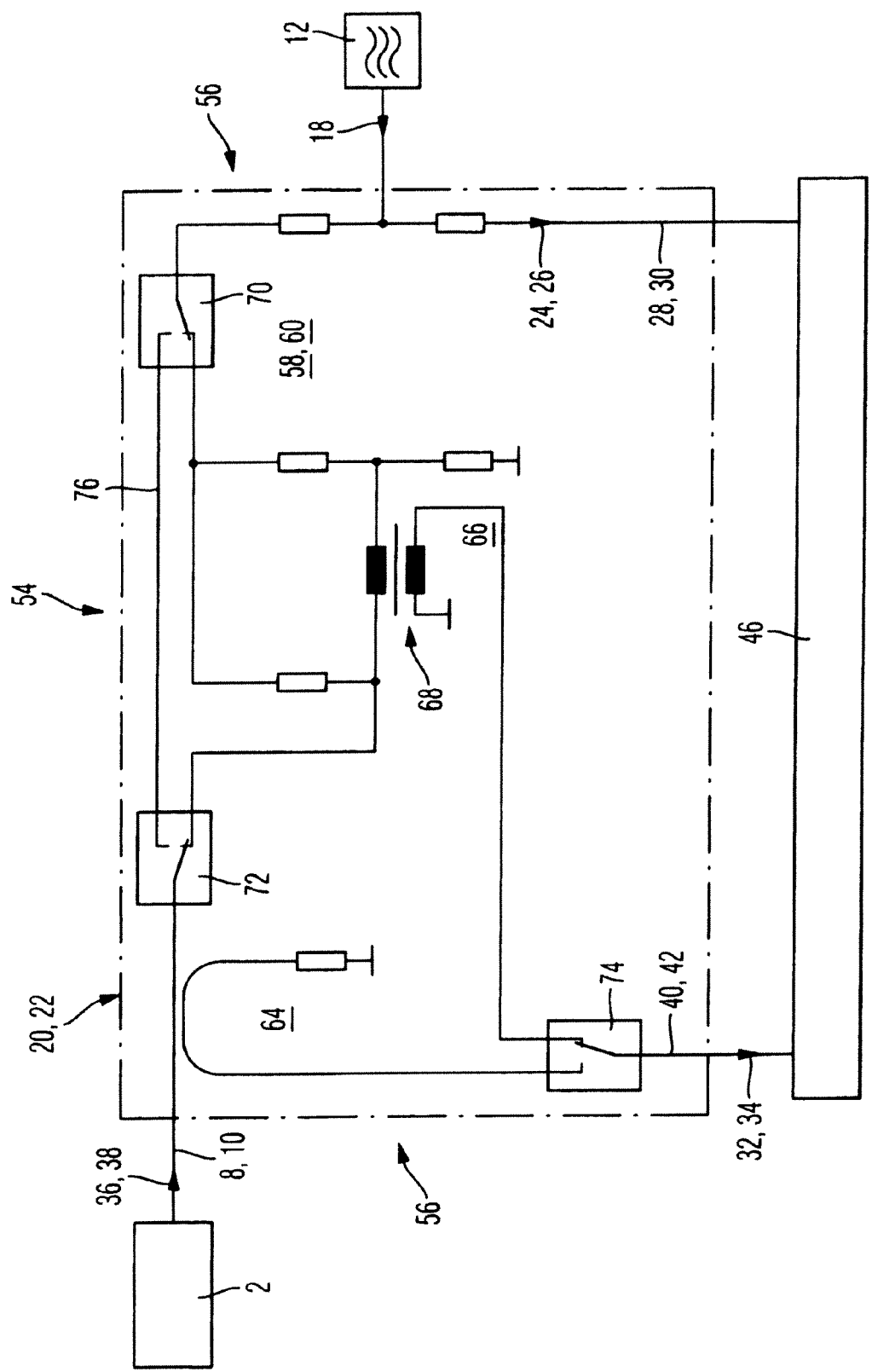
FIG. 2 is a circuit diagram of a first embodiment of a measuring bridge of the network analyzer according to the invention comprising a resistive bridge and a directional coupler connected in series thereto.
Figure 3:
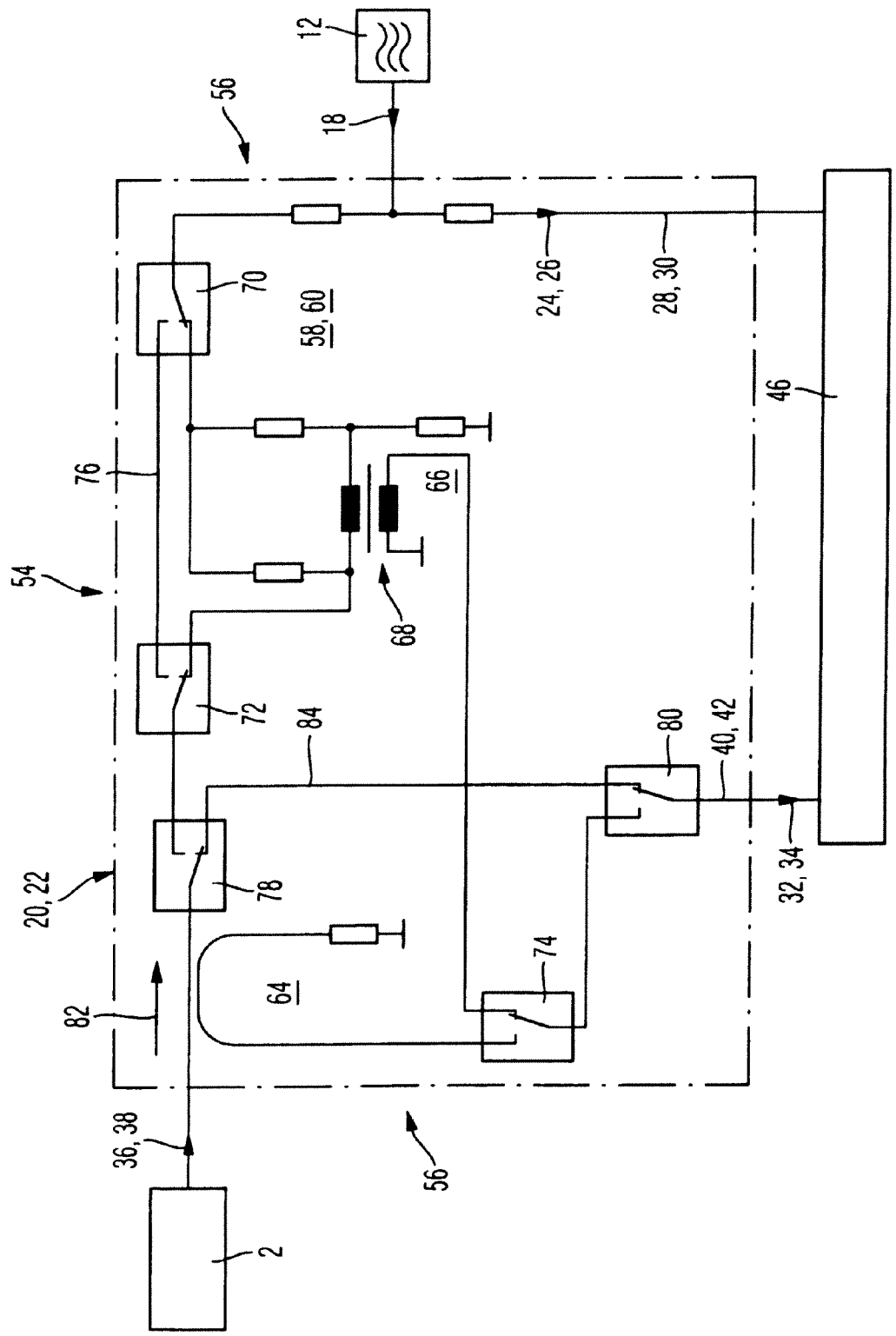
FIG. 3 is a circuit diagram of a second embodiment of a measuring bridge of the network analyzer according to the invention comprising a resistive bridge and a directional coupler connected in series thereto.
Figure 4:
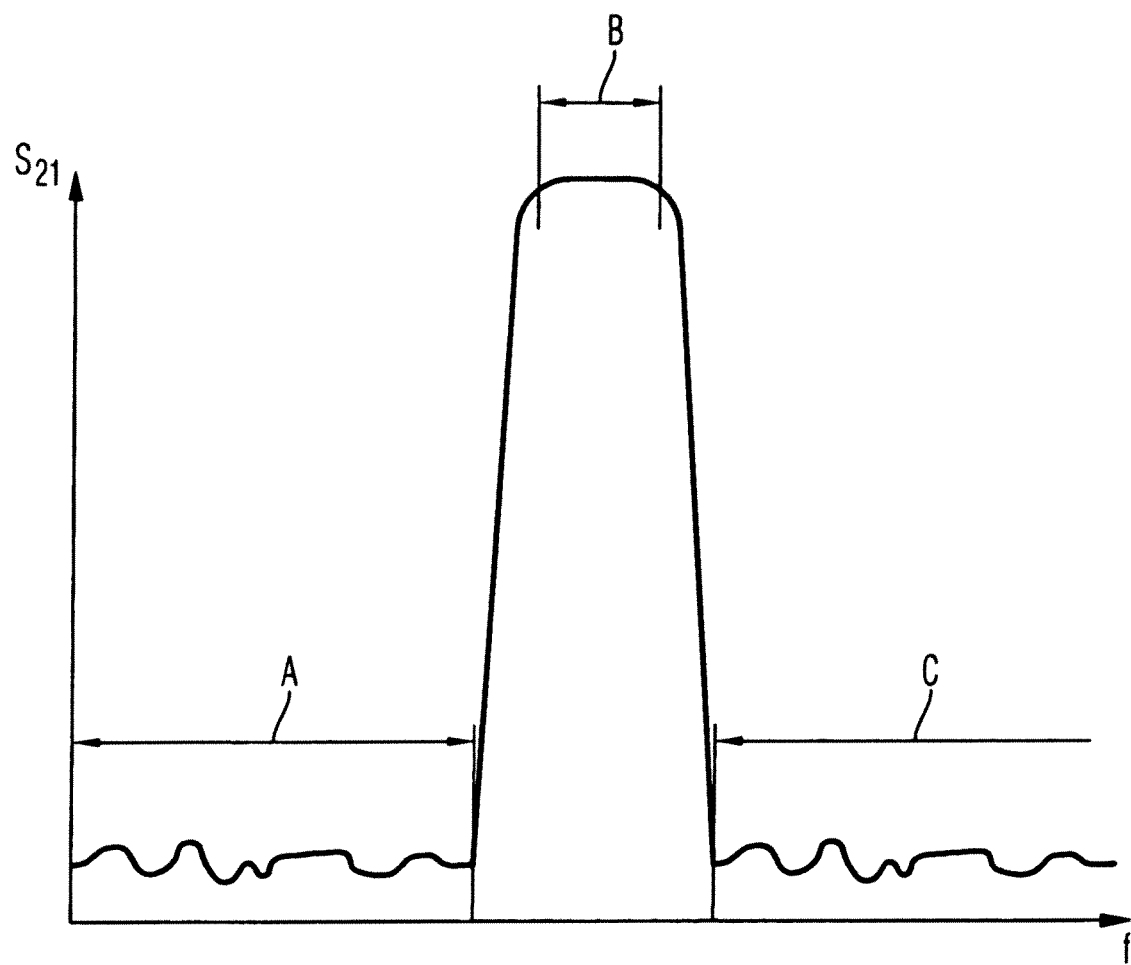
FIG. 4 shows a curve of the forward transmission coefficient $s_{21}$ of a test object configured as a band-pass filter in relation to frequency.

FIGS. 2 and 3 show a detailed circuit diagram of the measuring bridge 20, 22 of the network analyzer 1. For the sake of simplicity, the switch device 14 has been dispensed with and the measuring bridge 20, 22 is connected directly to the signal generator 12 via the measuring line 8, 10. Furthermore, the evaluation device 48 and the control device 50 are not shown in FIGS. 2 and 3. In addition, the measuring bridge 20, 22 is connected to the test object 2 via the measuring line 8, 10. The reference channel 28, 30 and the measuring channel 40, 42 are connected by means of signals to the A/D converter 46.

The measuring bridge 20, 22 shown in FIGS. 2 and 3 also comprises a resistive bridge 54 and a directional coupler 56 connected in series thereto. The resistive bridge 54 and the directional coupler 56 each comprise a reference branch 58 and 60 for decoupling the reference signal 24, 26 which corresponds to the excitation signal 18. The directional coupler 56 comprises a measuring branch 64 formed as a coupling path for decoupling the corresponding measuring signal 32, 34, which corresponds to the signal 36, 38 returning on the measuring line 8, 10. The resistive bridge 54 comprises a measuring branch 66 for decoupling the returning signal 36, 38 as the measuring signal 32, 34. In the resistive bridge 54, the measuring signal 32, 34 is decoupled by means of a transformer 68 on the measuring branch 66.

In order to switch between the directional coupler 56 and the resistive bridge 54, the measuring bridge 20, 22 comprises a signal-generator-side change-over switch 70 and a first test-object-side change-over switch 72. When the measuring bridge 20, 22 is operated as a resistive bridge 54, the signal-generator-side change-over switch 70 and the first test-object-side change-over switch 72 are switched downwards, as shown symbolically in FIGS. 2 and 3. In contrast thereto, the signal-generator-side change-over switch 70 and the first test-object-side change-over switch 72 are switched upwards when the measuring bridge 20, 22 operates as a directional coupler 56.

Furthermore, the measuring bridge 20, 22 comprises a first measuring-channel-side change-over switch 74 in order to transmit the decoupled measuring signal 32, 34 from the measuring branch 64 of the directional coupler 56 into the measuring channel 40, 42 of the measuring bridge 20, 22 when the measuring bridge 20, 22 operates as a directional coupler 56. For operating the measuring bridge 20, 22 as a resistive bridge 54, the first measuring-channel-side change-over switch 74 is switchable in order to connect the measuring branch 66 of the resistive bridge 64 to the measuring channel 40, 42 of the measuring bridge 20, 22.

When the measuring bridge 20, 22 operates as a directional coupler 56, the excitation signal 18 passes through a through-branch 76 of the directional coupler 56 with a comparatively low level of damping. The through-path 76 of the directional coupler 56 can be used over the entire frequency range swept through by the signal generator 12. The excitation signal 18 is decoupled on the reference branch 58 as the reference signal 64 and fed to the reference channel 28, 30 of the measuring bridge 20, 22. The returning signal 36, 38, which is transmitted through the test object 2 or is reflected at the input gate 4 or the output gate 6 of the test object 2, is decoupled as the measuring signal 32, 34 via the measuring branch 64 of the directional coupler 56.

The measuring branch 64, which is configured as a coupling path, is expediently positioned in the direct vicinity of the measuring line 8, 10 in such a way that the returning signal 36, 38 initially passes through a path portion of the measuring line 8, 10 in the direct vicinity of the measuring branch 64, before reaching the first test-object-side change-over switch 72. If, in contrast, the returning signal 36, 38 were decoupled on the measuring branch 64 after the first test-object-side change-over switch 72, it would be attenuated by the damping in the first test-object-side change-over switch 72. The directional coupler 56 is provided for operation the measuring bridge 20, 22 in an upper frequency range, for which operating of the measuring bridge 20, 22 as a resistive bridge 54 would not be suitable. The transformer 68 of the resistive bridge 54 comprises parasitic elements which would become noticeable through disruptive influences on the decoupled measuring signal 32, 34 at comparatively high frequencies.

In contrast to the directional coupler 56, the resistive bridge 54 is to be operated in the lower frequency range at comparatively low frequencies. Comparatively long coupling paths for decoupling the low-frequency signals would be required for operating the directional coupler 56 at low frequencies. Forming coupling paths of this type in the directional coupler 56 of the measuring bridge 20, 22 would cause particularly high conversion costs and would considerably increase the size of the measuring bridge 20, 22.

The measuring bridge 20, 22 shown in FIG. 3 differs from the measuring bridge 20, 22 shown in FIG. 2 only by two additional change-over switches, a second test-object-side change-over switch 78 and a second measuring-channel-side change-over switch 80. The second test-object-side change-over switch 78, like the first test-object-side change-over switch 72, expediently follows the arrangement of the measuring branch 64 of the directional coupler 56 in the direct vicinity of the measuring line 8, 10 in a direction of travel 82 of the returning signal 36, 38.

A through-path 84 can be connected by means of the second test-object-side change-over switch 78 and the second measuring-channel-side change-over switch, to which through-path the measuring line 8, 10 and the measuring channel 40, 42 of the measuring bridge 20, 22 can be connected. In this way, it is not necessary to decouple the returning signal 36, 38 via the measuring branch 64, which is formed as a coupling path, of the directional coupler 56 or via the transformer 68 of the measuring branch 66 of the resistive bridge 54. The signal 36, 38 returning on the measuring line 8, 10 is fed in a line-conducted manner via the through-path 84 to the measuring channel 40, 42 of the measuring bridge 20, 22 as a measuring signal 32, 34. When the measuring signal 32, 34 is fed in a line-conducted manner via the through-path 84, it undergoes only a comparatively low level of damping by the second test-object-side change-over switch 78 and the second measuring-channel-side change-over switch 80. A comparatively high level of damping of the measuring signal 32, 34 by decoupling on the directional coupler 56 or on the resistive bridge 54 is consequently avoided. Furthermore, it is possible to transmit the returning signal 36, 38 as the measuring signal 32, 34 via the through-path 84 over the entire frequency range swept through by the signal generator 12 without restrictions.

Transmitting the returning signal 36, 38 via the through-path 84 is particularly suitable for operating the measuring bridge 20, 22 as what is known as a transmission meter. The measuring bridge 22, which is connected to the output gate 6 of the test object 2 via the measuring line 10 (FIG. 1), may be operated, for example, as a transmission meter, and thus receives only one returning signal 38, i.e. an excitation signal 18, which is generated by the signal generator 12 and is fed via the measuring bridge 20 to the test object 2 via the input gate 4 thereof.

If, in contrast, the measuring bridge 20, 22 shown in FIG. 3 is operated as a reflection meter, the excitation signal 18 from the signal generator 12 is transmitted to the test object 2, and the returning signal 36, 38, which is reflected at the test object 2, is decoupled, both processes being carried out via the corresponding measuring bridge 20, 22. In a measuring bridge 20, 22 operated as a reflection meter, the second test-object-side change-over switch 78 would have to be switched after the excitation signal is fed to the test object 2 and before the returning signal 36, 38 is received. This type of switching via change-over switches 78, 80 formed as electromechanical switches would lead to considerable evaluation losses of the measuring signal 32, 34.

Consequently, the through-path 84 is activated in particular when the measuring bridge 20, 22 is operated as a transmission meter, via a corresponding switch position of the second test-object-side change-over switch 78 and of the second measuring-channel-side change-over switch 80, the measuring bridge 20, 22 merely transmitting the returning signal 36, 38, which is transmitted through the test object 2 and feeds it, as the measuring signal 32, 34, to the A/D converter 46. If the measuring bridge 20, 22 is operated as a reflection meter, the through-path 84 is basically deactivated so the excitation signal 18 is provided to the input gate 4 or the output gate 6 of the test object 2 and the returning signal 36, 38 can be decoupled without any problems on the measuring bridge 20, 22.

The invention is not limited to the embodiments shown and is in particular also suitable for network analyzers configured differently to that shown in FIG. 1, in particular those also comprising more than two measuring gates. All of the features described hereinbefore or shown in the drawings can be combined with one another as desired.

The invention claimed is:

1. Network analyzer comprising:
   a signal generator for generating an excitation signal which can be fed via a measuring line to a test object that can be connected to the network analyzer, and
   a measuring bridge connected by signals to the measuring line and via which a reference signal, which corresponds to the excitation signal, can be decoupled on a reference channel and a measuring signal, which corresponds to a signal returning from the test object, can be decoupled on a measuring channel,
   the measuring bridge comprising at least one resistive bridge and at least one directional coupler in such a way that the measuring bridge is operated in a lower frequency range as a resistive bridge and in an upper frequency range as a directional coupler,
   wherein
   the resistive bridge is connected in series to the directional coupler,
   a first test-object-side change-over switch is provided on the measuring line to make the returning signal available to either the resistive bridge or the directional coupler and to decouple said returning signal as the measuring signal via a measuring branch of the resistive bridge or via a measuring branch of the directional coupler,
   the measuring branch, which is formed as a coupling path, precedes the first test-object-side change-over switch in a direction of travel-of the signal returning in the measuring line,
   the measuring line can be connected by a line connection by a second test-object-side change-over switch to the measuring channel of the measuring bridge to form a through path, and
   the second test-object-side change-over switch is in line with the measuring branch, and is disposed between the test object and the measuring branch of the directional coupler in the direction of the signal returning in the measuring line.

2. Network analyzer according to claim 1 further change-over switches ace provided on the measuring bridge to switch, together with the first test-object-side change-over switch, from operation of the measuring bridge as a resistive bridge to operation of the measuring bridge as a directional coupler.

3. Network analyzer according to claim 2, wherein the change-over switches comprise electromechanical switches.

4. Network analyzer according to claim 1, comprising a signal-generator-side change-over switch provided on the measuring line to make the excitation signal available to either the resistive bridge or the directional coupler and to decouple the reference signal via either a reference branch of the resistive bridge or a reference branch of the directional coupler and to feed it to the reference channel of the measuring bridge.

5. Network analyzer according to claim 4, wherein the reference branch of the resistive bridge and the reference of the directional coupler are electrically connected at least in part, and are contained in a single unit.

6. Network analyzer according to claim 1, comprising a first measuring-channel-side change-over switch provided on the measuring channel to feed the measuring signal decoupled by the measuring branch of the directional coupler or by the measuring branch of the resistive bridge to the measuring channel of the measuring bridge.

7. Network analyzer according to claim 1, comprising a second measuring-channel-side change-over switch provided in the measuring channel of the measuring bridge to decouple the measuring signal via either the measuring branch of the directional coupler or via the measuring branch of the resistive bridge and to feed said signal to the measuring channel of the measuring or to feed said signal in a line-conducted manner via the through path, which is connected by a line connection to the measuring line to the measuring channel of the measuring bridge.

8. Network analyzer comprising:
   a signal generator for generating an excitation signal that can be fed via a measuring line to a test object that can be connected to the network analyzer, and
   a measuring bridge connected by signals to the measuring line and via which a reference signal, which corresponds to the excitation signal, can be decoupled on a reference channel and a measuring signal, which corresponds to a signal returning from the test object, can be decoupled on a measuring channel,
   the measuring bridge comprising at least one resistive bridge and at least one directional coupler in such a way that the measuring bridge is operated in a lower frequency range as a resistive bridge and in an upper frequency range as a directional coupler,
   wherein
   the resistive bridge is connected in series to the directional coupler,
   a first test-object-side change-over switch is provided on the measuring line to make the returning signal available to either the resistive bridge or the directional coupler and to decouple said returning signal as the measuring signal via a measuring branch of the resistive bridge or via a measuring branch of the directional coupler,
   the measuring branch, which is formed as a coupling path, precedes the first test-object-side change-over switch in a direction of travel-of the signal returning in the measuring line, and
   the measuring line can be connected by a line connection by a second test-object-side change-over switch to the measuring channel of the measuring bridge to form a through path
   the network analyzer further comprising a second measuring-channel-side change-over switch provided in the measuring channel of the measuring bridge to decouple the measuring signal via either the measuring branch of the directional coupler or via the measuring branch of the resistive bridge and to feed said signal to the measuring channel of the measuring bridge or to feed said signal in a line-conducted manner via the through path, which is connected by a line connection to the measuring line to the measuring channel of the measuring bridge.

9. Network analyzer according to claim 8, comprising further change-over switches provided on the measuring bridge to switch, together with the first test-object-side change-over switch, from operation of the measuring bridge as a resistive bridge to operation of the measuring bridge as a directional coupler.

10. Network analyzer according to claim 9, wherein the change-over switches comprise electromechanical switches.

11. Network analyzer according to claim 8, comprising a signal-generator-side change-over switch provided on the measuring line to make the excitation signal available to either the resistive bridge or the directional coupler and to decouple the reference signal via either a reference branch of the resistive bridge or a reference branch of the directional coupler and to feed it to the reference channel of the measuring bridge.

12. Network analyzer according to claim 11, wherein the reference branch of the resistive bridge and the reference of the directional coupler are electrically connected at least in part, and are contained in a single unit.

13. Network analyzer according to claim 8, comprising a first measuring-channel-side change-over switch provided on the measuring channel to feed the measuring signal decoupled by the measuring branch of the directional coupler or by the measuring branch of the resistive bridge to the measuring channel of the measuring bridge.

* * * * *